United States Patent
Downie et al.

(10) Patent No.: US 11,919,009 B2
(45) Date of Patent: Mar. 5, 2024

(54) MEASURING MAGNETIC DEBRIS BUILDUP IN A MAGNETIC FILTER

(71) Applicant: ADEY HOLDINGS (2008) LIMITED, Cheltenham (GB)

(72) Inventors: Simon Downie, Cheltenham (GB); Kashem Pathan, Worcester (GB); Matthew Taylor, Cheltenham (GB)

(73) Assignee: ADEY HOLDINGS (2008) LIMITED, Cheltenham (GB)

( * ) Notice: Subject to any disclaimer, the term of this patent is extended or adjusted under 35 U.S.C. 154(b) by 622 days.

(21) Appl. No.: 16/753,136

(22) PCT Filed: Oct. 2, 2017

(86) PCT No.: PCT/GB2017/052952
§ 371 (c)(1),
(2) Date: Apr. 2, 2020

(87) PCT Pub. No.: WO2019/069039
PCT Pub. Date: Apr. 11, 2019

(65) Prior Publication Data
US 2020/0254462 A1    Aug. 13, 2020

(51) Int. Cl.
*B03C 1/28* (2006.01)
*C02F 1/48* (2023.01)
(Continued)

(52) U.S. Cl.
CPC .............. *B03C 1/282* (2013.01); *B03C 1/286* (2013.01); *C02F 1/488* (2013.01);
(Continued)

(58) Field of Classification Search
CPC ......... B03C 1/282; B03C 1/286; B03C 1/288; B03C 1/00; B03C 2201/24;
(Continued)

(56) References Cited

U.S. PATENT DOCUMENTS 3,246,753 A    4/1966    Laurila
4,784,762 A    11/1988   Taliaferro
(Continued)

FOREIGN PATENT DOCUMENTS

CN    102078725 A    6/2011
CN    203116161 U    8/2013
(Continued)

OTHER PUBLICATIONS

Honeywell '3-Axis Digital Compass IC HMC5883L' Hall Effect Sensor.
(Continued)

*Primary Examiner* — Liam Royce
(74) *Attorney, Agent, or Firm* — Jacob M. Ward; Ward Law Office LLC

(57) ABSTRACT

A magnetic debris level measuring device for a magnetic filter is disclosed. The magnetic debris level measuring device includes a magnetometer and a temperature sensor. The temperature measured by the temperature sensor is used to calculate a corrected magnetometer reading, which in turn can be used to determine the amount of captured magnetic debris held within the filter. The device has a stored threshold for the corrected magnetometer reading, and when the corrected magnetometer reading crosses the stored threshold a notification is issued that the filter is full. If it is detected that debris continues to be captured after the 'full' notification has been issued, the stored threshold will be updated accordingly.

13 Claims, 4 Drawing Sheets

(51) Int. Cl.
  *G01R 33/00* (2006.01)
  *G01R 33/02* (2006.01)
(52) U.S. Cl.
  CPC ..... *G01R 33/0082* (2013.01); *G01R 33/0206* (2013.01); *B03C 2201/24* (2013.01); *B03C 2201/32* (2013.01); *C02F 2209/006* (2013.01); *C02F 2209/008* (2013.01); *C02F 2209/02* (2013.01); *C02F 2209/445* (2013.01)
(58) Field of Classification Search
  CPC ........ B03C 2201/32; C02F 1/488; C02F 1/48; C02F 2209/006; C02F 2209/008; C02F 2209/02; C02F 2209/445; G01R 33/0082; G01R 33/0206; F24D 19/0092
  See application file for complete search history.

(56) References Cited

U.S. PATENT DOCUMENTS

| | | | |
|---|---|---|---|
| 5,051,177 | A | 9/1991 | Dauchez |
| 5,118,410 | A | 6/1992 | Rumberger |
| 5,334,932 | A * | 8/1994 | Nielsen ............ G01N 33/2858 324/225 |
| 6,143,171 | A | 11/2000 | Van Aarsen |
| 10,500,595 | B2 * | 12/2019 | Olbermann ............ B03C 1/282 |
| 10,543,492 | B2 | 1/2020 | Rhodes |
| 2007/0090055 | A1 | 4/2007 | Newman et al. |
| 2007/0106527 | A1 * | 5/2007 | McKinney ............ G06Q 10/20 705/305 |
| 2007/0175830 | A1 | 8/2007 | Brassard |
| 2010/0176035 | A1 | 7/2010 | Brandner et al. |
| 2012/0086445 | A1 | 4/2012 | Bradley et al. |
| 2015/0068964 | A1 | 3/2015 | McAllorum et al. |
| 2015/0377987 | A1 | 12/2015 | Menon et al. |
| 2018/0221796 | A1 | 8/2018 | Bonifas et al. |
| 2020/0254462 | A1 | 8/2020 | Downie et al. |
| 2021/0276894 | A1 | 9/2021 | Bossini |

FOREIGN PATENT DOCUMENTS

| | | |
|---|---|---|
| CN | 104061620 A | 9/2014 |
| CN | 104334282 A | 2/2015 |
| CN | 204268579 U | 4/2015 |
| CN | 104984623 A | 10/2015 |
| CN | 206269225 U | 6/2017 |
| DE | 9001431 U1 | 4/1990 |
| EP | 1331035 A1 | 7/2003 |
| EP | 2524730 A2 | 11/2012 |
| EP | 2977688 A1 | 1/2016 |
| EP | 3159313 A1 | 4/2017 |
| FR | 2566283 A1 | 12/1985 |
| FR | 2697760 A1 | 5/1994 |
| FR | 2697760 B1 | 1/1995 |
| GB | 2029580 A | 3/1980 |
| GB | 2450086 A | 12/2008 |
| GB | 2491246 A | 11/2012 |
| GB | 2500908 A | 10/2013 |
| GB | 2551828 A | 1/2018 |
| WO | 2007132154 A1 | 11/2007 |

OTHER PUBLICATIONS

Allegro MicroSystems Inc 'Micro Power Ultra-Sensitive Hall-Effect Switch A1172'—created 2008-2009 (and as described in U.S. Pat. Nos. 5,045,920; 5,264,783; 5,442,283; 5,389,889; 5,581,179; 5,517,112; 5,619,137; 5,621,319; 5,650,719; 5,686,894; 5,694,038; 5,729,130; 5,917,320).

Allegro MicroSystem LLC 'Monolithic Magnetic Hall Sensor IC Using Dynamic Quadrature Offset Cancellation'—First published Jun. 6, 1997.

Honeywell 'Hall effect Sensing and application' handbook 'Printed in the USA Nov. 1998' (final p. 126).

* cited by examiner

MEASURING MAGNETIC DEBRIS BUILDUP IN A MAGNETIC FILTER

CROSS-REFERENCE TO RELATED APPLICATIONS

This patent application is a United States National Stage of International Patent Application No. PCT/GB2017/052952, filed on Oct. 2, 2017. The entire disclosure of the above patent application is hereby incorporated herein by reference.

TECHNICAL FIELD

The present invention relates to measuring the amount of magnetic debris which has been captured by a magnetic filter, particularly a magnetic filter used in a central heating system.

BACKGROUND TO THE INVENTION

It is now common to fit a magnetic filter to a central heating system. In a basic form, the magnetic filter includes a chamber having an inlet and outlet, the magnetic filter being attached to the central heating circuit so that central heating system water flows into the inlet of the magnetic filter, through the chamber, and out of the outlet to continue around the heating circuit. A magnet is provided within the chamber, and as fluid flows through the chamber the magnet will attract magnetic debris from the system water, removing the magnetic debris from the flow and retaining it in the chamber.

Removing magnetic debris from the system water protects the heat exchanger in the boiler which is otherwise liable to become clogged due to the debris in the flow. However, eventually the filter will become full and will stop capturing any more debris. At this stage, the filter needs to be emptied so that it can continue to remove debris and protect the system.

It can be difficult to predict a suitable service interval for a magnetic filter, since different central heating systems will produce different amounts and types of magnetic debris. A filter newly-fitted to an old heating system will initially capture a lot of magnetic debris, but over time the amount captured is likely to fall when the system has been substantially cleaned of the debris which built up over time. Eventually, the capture rate will drop to no more than the rate at which iron oxide debris is disposed into the system water from the insides of radiators due to corrosion. Again, this 'steady state' rate will depend on the age and condition of the radiators in the system.

Guidance on servicing magnetic filters has generally been based on a fairly arbitrary servicing interval, which attempts to ensure that most filters will be cleaned often enough without requiring unnecessarily expensive frequent servicing. Typically a filter may be cleaned once a year, which corresponds to a typical servicing and safety check interval for a gas boiler. However, for a filter newly fitted to an old system, a more frequent servicing interval, for example once every 60 days for the first 6-12 months, may be highly beneficial. For a filter fitted to a modern system with radiators which do not corrode at a high rate, cleaning the filter every year might be unnecessary.

It is an object of the invention to measure the amount of magnetic debris captured in a magnetic filter in a central heating system, so that the filter can be cleaned as and when it is necessary to do so.

SUMMARY OF THE INVENTION

According to the present invention, there is provided a captured debris level measuring device for a magnetic filter in a central heating system,
the measuring device including:
a magnetometer for mounting to the magnetic filter to measure magnetic field strength due to the magnet and any captured magnetic debris;
a temperature sensor for mounting to the magnetic filter; and
a control unit, the magnetometer and temperature sensor being connected to inputs of the control unit, and output means being provided adapted to issue a notification based on a combination of the magnetometer reading and the temperature sensor reading to provide an indication when the amount of magnetic debris captured within the filter exceeds a threshold level.

The magnetometer is mounted to the magnetic filter at a fixed point relative to the magnet. In a preferred embodiment, this is outside the chamber of the magnetic filter, but in other embodiments the magnetometer could be mounted inside if it were suitably protected from water. The magnetometer measures the magnetic field strength at this fixed point, which is found to vary predictably based on the amount of magnetic debris which has been captured by the magnet.

All magnets are affected by temperature. The magnets typically used in a magnetic filter in a heating system have a maximum operating temperature of around 120 degrees Celsius. As long as this temperature is not exceeded, significant effects of temperature will only be temporary, i.e. there is no permanent damage or modification of the properties of the magnet as long as the temperature is below this level. However, the temperature needs to be measured and accounted for in order to compensate for the temporary effects and provide an accurate indication as to how much magnetic debris has been captured by the filter.

One simple embodiment may operate simply by ignoring magnetometer readings when the temperature reading is outside a set range. For example, the control unit could be calibrated with an appropriate threshold whereby at a temperature of say between 15 and 25 degrees Celsius, a magnetometer reading which exceeds or drops below the threshold indicates that the filter is full up and should be cleaned. If it can be assumed that at some reasonably frequent times the heating system will be turned off and so the water will be at more or less ambient temperature, then this may be adequate.

However, other embodiments may preferably take account of the temperature to estimate the amount of magnetic debris currently within the filter, whatever the current temperature measured by the temperature sensor. Central heating system water is typically up to around 85 degrees when the heating system is turned on, although depending on the boiler and settings this can vary within a wide range. When heating up or cooling down, the water can be at any temperature between the ambient room temperature and the maximum flow temperature of the system.

The temperature sensor is preferably provided in contact with the outside wall of the canister of the magnetic filter. Although this is obviously slightly thermally insulated from the magnet and the water inside the filter, measuring the temperature in contact with the outside wall is generally found to be of use for a reasonably accurate reading. As an alternative, the temperature sensor could be provided inside the magnetic filter, if suitably protected from water. In other embodiments, delayed response of the temperature sensor caused by insulation between the temperature sensor and the magnet can be accounted for simply by only taking a measurement after the reading from the temperature sensor has been constant within some predetermined range for a period of time. For example, a valid measurement may be taken if the reading has not changed by more than 1 degree Celsius within a period of 1 minute.

The control unit may be adapted to compute a corrected magnetometer reading according to a computation of the form:

$$y_c = (y_0 - t^x) + C$$

Where $y_c$ is the corrected magnetometer reading, $y_0$ is the raw magnetometer reading taken from the magnetometer, t is the temperature measured by the temperature sensor, x is a correction exponent and C is a constant.

Once computed, the corrected magnetometer reading $y_c$ can be compared to a threshold level. When the corrected magnetometer reading exceeds or drops below the threshold level, an indication can be issued to say that the filter is full and should be cleaned. In more advanced embodiments, the corrected magnetometer reading can be used to provide an output indicating the approximate amount of magnetic debris currently retained within the filter, for example output LEDs may be provided to show that the filter is 0-25% full, 25-50% full, 50%-75% full, or 75%-100% full. The corrected magnetometer reading with an appropriate offset C is in principle correlated to the amount of magnetic debris captured (depending on the orientation of the magnetic field at the point of mounting of the magnetometer, it may be positively or negatively correlated), and the corrected magnetometer reading can be appropriately scaled to derive an estimate of the amount of magnetic debris captured within the filter, from completely empty (0%) to full (100%).

A suitable value for the correction exponent x can be determined experimentally by measuring the raw magnetometer value at multiple different temperatures, when the amount of magnetic debris in the filter is known to be the same. The correction factor x can then be determined according to the computation:

$$x = \frac{\log(t_1 - t_2)}{\log(y_1 - y_2)}$$

Where $y_1$ is the magnetometer reading at temperature $t_1$ and $y_2$ is the magnetometer reading at temperature $t_2$.

The computation can be repeated for multiple tuples of readings $(y_1, y_2, t_1, t_2)$. It is found that the value for x derived each time is fairly consistent for a particular filter within a normal range of temperatures.

The correction exponent may be further adjusted and selected in order to minimise the range of corrected values $y_c$ over the range of temperatures for a constant amount of magnetic debris in the filter. In one embodiment, 1.6 is found to be a suitable value for the correction exponent. However, other values for the correction exponent may be used in other embodiments, depending on the particular characteristics of the filter and the measuring device.

The value for C can be calculated simply by choosing C such that the corrected $y_c$ is zero when the filter is empty. An empty filter state may be indicated by pressing a "reset" button in some embodiments. This may have the effect of setting a value of C when the reset button is pressed.

Optionally, a scale factor may then be applied, i.e. a factor multiplying $y_c$ such that the resulting value is in the range, for example, of 0-100 when the corrected magnetometer reading $y_c$ is between 0 and the threshold at which the filter is said to be full. It should be noted that in many embodiments the threshold may be set so that the indication is issued to prompt cleaning at a point when the filter is nearly, but not completely full. The scaled value may therefore in principle be greater than 100 in this example when the filter is "overfull". Also, whether the corrected magnetometer reading $y_c$ is positive or negative, and whether it is increasing or decreasing as magnetic debris accumulates, depends on the orientation of the magnetic field in relation to the magnetometer. In some embodiments therefore, the scale factor may be negative. The "full" threshold is typically defined as a relative offset from the zero point when the reset button is pressed. This may also be considered as setting the threshold at an absolute value of the corrected magnetometer reading, after the offset C has been applied.

According to a second aspect of the invention, there is provided a method of measuring the amount of magnetic debris captured within a magnetic filter in a central heating system, the magnetic filter having a chamber with an inlet and an outlet connected to the central heating system circuit, and a magnet provided within the chamber, the method comprising:

providing a magnetometer mounted to the magnetic filter;
providing a temperature sensor mounted to the magnetic filter;
calculating a corrected magnetometer reading from the magnetometer reading and the temperature sensor reading, and using the corrected magnetometer reading to determine when the amount of magnetic debris captured within the filter exceeds a threshold level.

Preferable/optional features of the second aspect of the invention are recited in claims 15 to 23.

According to a third aspect of the present invention, there is provided a captured debris level measuring device for a magnetic filter in a central heating system, the magnetic filter including a separation chamber, an inlet to the chamber and an outlet from the chamber, and a magnetic element disposed within the chamber for attracting magnetic debris and removing the magnetic debris from the system water as it flows through the chamber,
and the measuring device including a magnetometer for mounting to the magnetic filter to measure magnetic field strength due to the magnet and any captured magnetic debris;
a control unit, the magnetometer being connected to an input of the control unit, and the control unit being adapted to issue a notification on output means when the magnetic field strength measured by the magnetometer exceeds or drops below a stored threshold,
the control means further being adapted to monitor the magnetic field strength measured by the magnetometer after the notification is issued, and in the case that the measured magnetic field strength rises further above the threshold or drops further below the threshold, to update the stored threshold according to the measured reading.

The magnetometer may output increasing or decreasing readings as the filter fills up, depending on the orientation of the magnetic field in relation to the magnetometer. Hence the "full" notification may be issued when the measured magnetic field strength rises above the stored threshold, or when the measured magnetic field strength drops below the stored threshold, in different embodiments.

The measured magnetic field strength may be a raw measurement from the magnetometer, or alternatively in some embodiments may be a corrected measurement, for example calculated to compensate for temperature, or may be an average or other amalgamation of several readings to compensate for noise.

The strength and direction of the magnetic field produced by different magnets in a batch may be variable. Furthermore, the magnetic field strength measured by the magnetometer at whatever point the magnetometer is mounted will depend not only on the magnet in the filter and the amount of material captured, but also the type of material captured. In sealed heating systems the bulk of the magnetic material removed is Iron(II,III) oxide ("magnetite" or "black iron oxide"), whereas open-vented heating systems may contain more significant amounts of Iron(III) oxide ("red iron oxide"). These materials have different magnetic properties, and therefore the magnetic field strength measured by the magnetometer will have a different relationship with the used and remaining capacity of the filter, depending on the exact composition of the magnetic dirt being removed in a particular heating system.

It is therefore advantageous to provide a system which updates the stored threshold value if the measured magnetic field continues to change after the previous stored threshold has been crossed. Once the "full" notification has been issued, it is unlikely that a filter will be cleaned straight away. Between the "full" notification being issued and the filter being cleaned, more dirt may be collected. The stored threshold will therefore be increased/decreased, so that once the filter is cleaned and reset, more dirt will be captured before the next "full" notification is issued. After a number of cycles of cleaning and resetting the filter, the stored threshold is likely to closely approximate the actual capacity of the filter, so that the servicing interval has increased to the maximum interval (i.e. minimum amount of servicing) necessary to ensure constant removal of magnetic debris from the central heating system.

The control unit may include data transmission means, and may be adapted to transmit measured magnetic field strength data to a central server. Data collected from a large number of filters, operating in different heating systems under different conditions, may be used to determine the stored threshold to program into new captured debris level measuring devices at the point of manufacture.

DESCRIPTION OF THE DRAWINGS

For a better understanding of the invention, and to show more clearly how it may be carried into effect, a preferred embodiment will now be described with reference to the accompanying drawings, in which.

DESCRIPTION OF THE EMBODIMENTS

Figure 1:
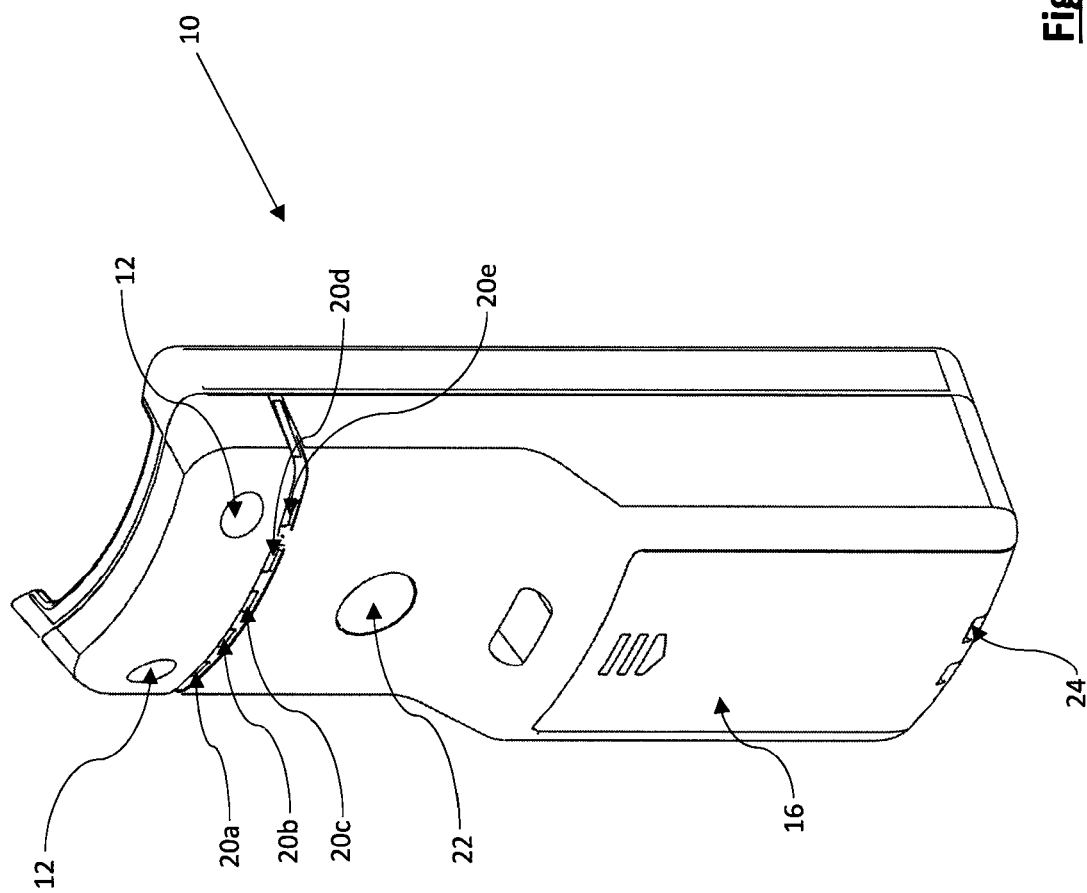
FIG. 1 is a perspective view of a captured debris level measuring device according to first and third aspects of the invention.
Figure 2:
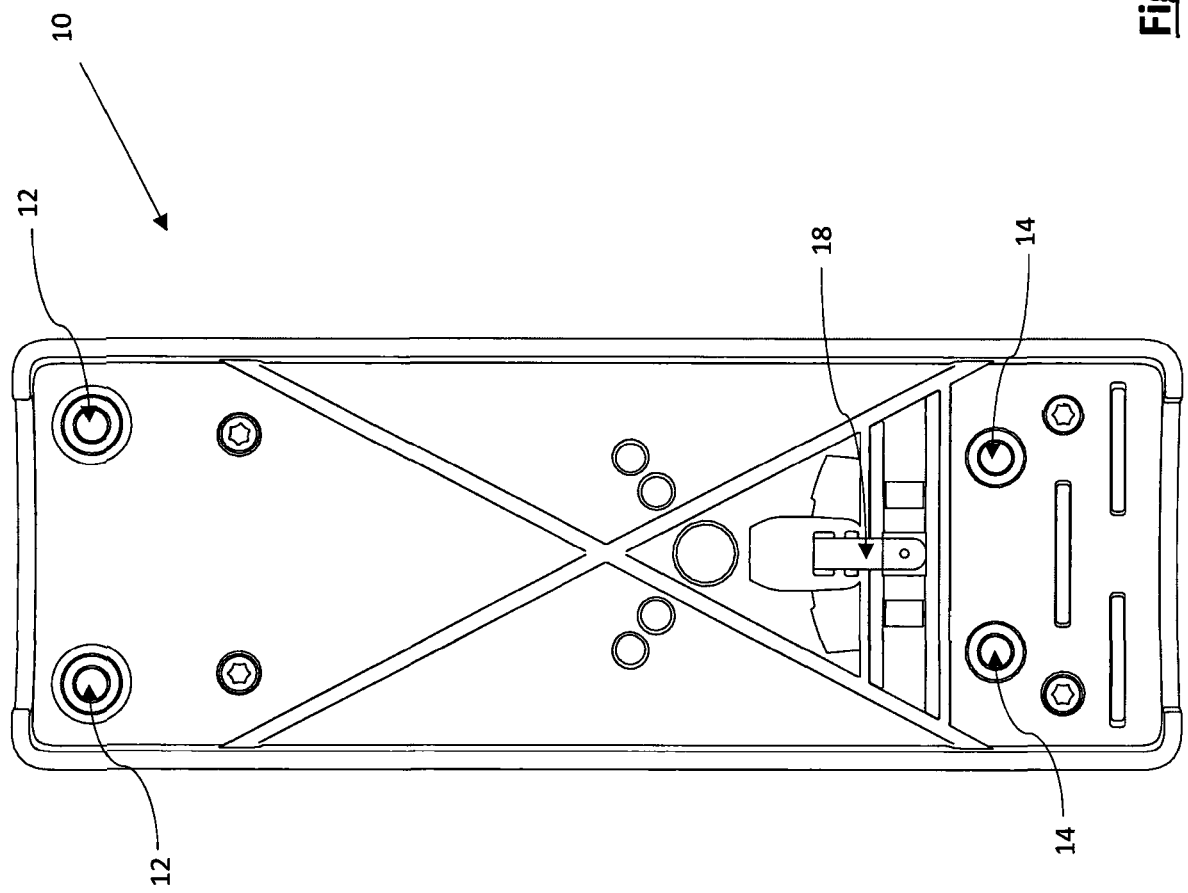
FIG. 2 is a rear plan view of the captured debris level measuring device of FIG. 1.

Referring firstly to FIGS. 1 and 2, a captured debris level measuring device is indicated generally at 10. The level measuring device is designed to be fitted to a magnetic filter, with the back of the level measuring device (FIG. 2) against a wall of the filter. The level measuring device 10 is fitted to the filter in this case by means of screws. Two screws are provided through counterbored apertures 12 near the top of the device 10. Two further screw fixings are provided through apertures 14 near the bottom of the device 10. In FIG. 1 the fronts of these apertures (14) are obscured by a battery compartment cover 16.

The device 10 is fixed semi-permanently to the magnetic filter in use, so that the device 10 will not move in relation to the filter. The level measuring device 10 contains a three-axis magnetometer (not visible in the figures as it is within the housing of the device 10). The three-axis magnetometer is fixed in position within the housing of the device 10, and so when the device 10 is fixed to the magnetic filter in use, the three-axis magnetometer will be in a fixed position and orientation in relation to the magnet within the magnetic filter.

A temperature sensor 18 protrudes from the back of the housing of the level measuring device 10. Preferably, the temperature sensor 18 is provided mounted on a leaf spring, one end of the leaf spring being fixed relative to the housing of the device 10 and the other free end being movable towards the housing of the device 10 against the action of the spring. Therefore, when the device 10 is fixed to a magnetic filter with the back of the device abutting the exterior wall of the magnetic filter, the temperature sensor 18 on the free end of the leaf spring will be pressed against the exterior wall of the magnetic filter. The temperature sensor is therefore mounted in the best position to measure the temperature of the filter, whilst still being outside the filter and therefore protected from water damage. Mounting the temperature sensor on a spring in this way also allows for simple and effective retrofitting of the level measuring device to an existing magnetic filter.

In FIG. 1, the user interface to the level measuring device is apparent in the form of five LEDs 20a, b, c, d, e and a pushbutton 22. Embodiments may also include data communication means such as NFC, Bluetooth, etc. for providing a more advanced interface and data exchange capabilities.

In operation, the first four LEDS 20a, b, c, d (green in this embodiment) indicate the detected level of magnetic debris captured in the filter. When the captured debris is detected at between 0-25% of capacity, only the first LED 20a will light. When the captured debris is between 25-50%, the first two LEDs 20a, b will light. When the captured debris is between 50-75%, the first three LEDs 20a, b, c will light. When the captured debris is between 75-100%, the first four LEDs 20a, b, c, d will light. The fifth LED 20e is a battery low indicator.

In order to conserve power, in normal circumstances no LEDs will be illuminated. Only when the momentary pushbutton 22 is pressed will the appropriate LEDs be illuminated to show the level of magnetic debris captured and the battery status.

A further pushbutton 24 is located towards the bottom of the device. This pushbutton 24 is a reset button. The button is small and located within a recess in the housing, and so is designed to be difficult to push by mistake. When the filter is serviced the reset pushbutton 24 should be pressed to calibrate the device 10, i.e. pressing the reset pushbutton 24 causes the controller to store the current magnetometer reading (or corrected magnetometer reading) as indicating an empty filter. Where a corrected magnetometer reading is defined as $y_c=(y_0-t^x)+C$ in the way described above, storing a "zero offset" is equivalent to updating the value for C.

Figure 3:
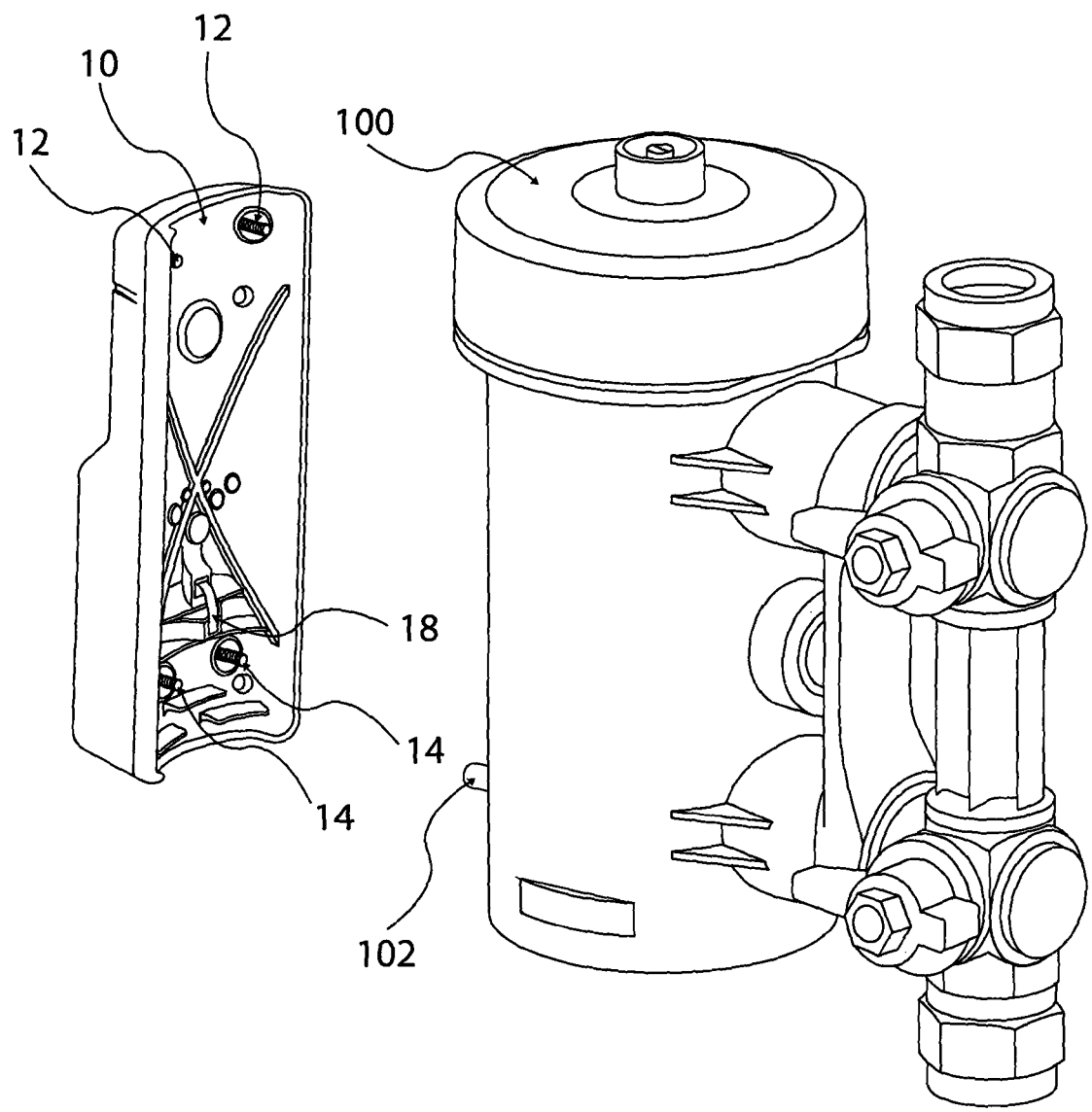
FIG. 3 is a perspective view of the captured debris level measuring device of FIG. 1, shown together with a magnetic filter.
Figure 4:
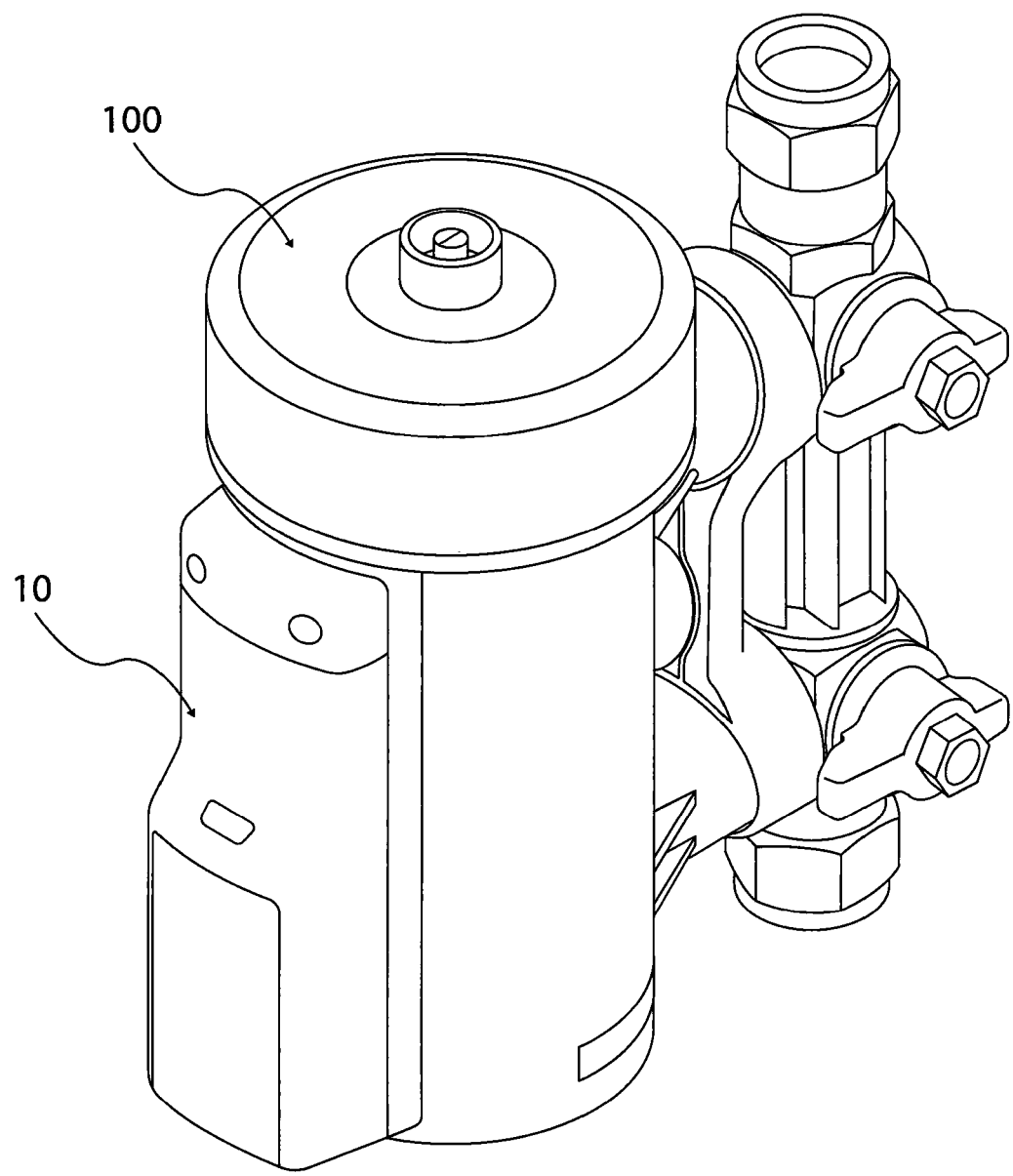
FIG. 4 is a perspective view of the captured debris level measuring device and filter of FIG. 3, with the captured debris level measuring device installed on the filter.

Referring now to FIGS. 3 and 4, it is apparent how the level measuring device 10 is fixed onto a magnetic filter 100. Bosses 102 (just one is visible in the perspective of FIG. 3) are provided on the outer wall of the housing of the filter, in positions corresponding to the screw apertures 12 of the level measuring device 10. The temperature sensor 18 mounted on a leaf spring is pressed against the outer wall of the filter 100 when the level measuring device 10 is fixed onto the filter 100.

In use, the temperature sensor (18) and the magnetometer measure respectively the temperature of the exterior wall of the filter 100 and the magnetic field strength at a fixed point just outside the filter 100. Because of the thermal insulation provided by the filter wall, the temperature measured by the temperature sensor 18 will lag the flow temperature of the heating system, for example by a few minutes. However, if there has not been any significant change in the temperature measured for a period of time, for example no change of more than 1° C. within a period of 1 minute, then it can be assumed that the temperature measured by the sensor 18 closely approximates the flow temperature of the heating system, which in turn will closely approximate the temperature of the magnet within the filter. The temperature measured by the temperature sensor and the raw magnetic field strength measured by the magnetometer can therefore be used to calculate a corrected magnetic field strength in the manner described above. The magnetic field strength can then be scaled to derive an indication of the amount of magnetic debris within the filter, for example on a scale of 0 (empty) to 100 (full). The amount of debris can then be output, for example using the LEDs as described above, or communicated to a server by wired or wireless communication means.

Scaling the corrected magnetic field strength involves the use of two stored reference values—an 'empty' reference value and a 'full' reference value. The full reference value is stored as an offset from the empty reference value. The 'empty' reference value is stored as the current value of the corrected magnetometer reading when the reset pushbutton 24 is pressed. Alternatively setting the empty reference value could be implemented as setting a value for the constant C. The 'full' reference value is set on manufacture to a fairly low value, i.e. to a value which given the variance in magnets and also the types of dirt collected, will in most cases be reached before the magnetic filter is in fact completely full. However, the control unit is configured to detect when the amount of captured debris continues to increase after the 'full' reference value has been reached, and if the amount of captured debris does increase then the stored 'full' reference value can be updated accordingly. In this way, for a particular filter installed in a particular system, over time the control unit will 'learn' when the filter is really full up, and cleaning of the filter can be reduced to the minimum amount necessary to ensure continuous capture of magnetic debris. Apart from saving labour, this has the advantage that the threads, seals etc. on the filter are less susceptible to damage since the filter will have to be disassembled less often.

It will be appreciated that the preferred embodiment is provided as an example of how the inventions may be incorporated into a product. Different features described may be provided in different combinations. The invention is defined by the claims.

The invention claimed is:

1. A captured debris level measuring device for a magnetic filter in a central heating system, the captured debris measuring device comprising:
   a magnetometer for mounting to the magnetic filter to measure a magnetic field strength due to a magnet and any captured magnetic debris;
   a temperature sensor for mounting to the magnetic filter; and
   a control unit, the magnetometer and temperature sensor being connected to inputs of the control unit, and output means being provided adapted to issue a notification based on a combination of the magnetometer reading and the temperature sensor reading to provide an indication when the amount of debris captured within the filter exceeds a threshold level,
   the control unit being adapted to use a reading from the temperature sensor in making a determination as to the amount of magnetic debris captured only when the temperature sensor reading has not changed by more than a predetermined temperature for a predetermined time.

2. The captured debris level measuring device of claim 1, wherein the control unit is adapted to issue a notification based on a magnetometer reading exceeding or dropping below a stored threshold when the temperature sensor reading is within a predetermined range.

3. The captured debris level measuring device of claim 1, wherein the control unit is adapted to combine a temperature reading from the temperature sensor with a raw magnetic field strength reading from the magnetometer to derive a corrected magnetic field strength.

4. The captured debris level measuring device of claim 3, wherein the control unit is adapted to calculate a corrected magnetic field strength $y_c$ $$y_c=(y_0-t^x)+C$$

where $y_0$ is the raw magnetometer reading taken from the magnetometer, t is the temperature measured by the temperature sensor, x is a correction exponent and C is a constant.

5. The captured debris level measuring device of claim 4, wherein the correction exponent x is determined according to $$x = \frac{\log(t_1 - t_2)}{\log(y_1 - y_2)}$$

where $y_1$ is the magnetometer reading at temperature $t_1$ and $y_2$ the magnetometer reading at temperature $t_2$, where $y_1, t_1, y_2, t_2$ are obtained experimentally for a constant amount of magnetic debris within the filter.

6. The captured debris level measuring device of claim 3, wherein the control unit is adapted to compare the corrected magnetic field strength to a stored threshold level, the notification being issued when the corrected magnetometer reading exceeds or drops below the stored threshold level.

7. The captured debris level measuring device of claim 6, wherein the control unit is adapted to detect when the amount of magnetic debris captured continues to increase after the stored threshold level has been crossed, and to update the stored threshold level accordingly.

8. A captured debris level measuring device for a magnetic filter in a central heating system, the captured debris measuring device comprising:
- a magnetometer for mounting to the magnetic filter to measure a magnetic field strength due to a magnet and any captured magnetic debris;
- a temperature sensor for mounting to the magnetic filter; and
- a control unit, the magnetometer and temperature sensor being connected to inputs of the control unit, and output means being provided adapted to issue a notification based on a combination of the magnetometer reading and the temperature sensor reading to provide an indication when the amount of debris captured within the filter exceeds a threshold level, the control unit being adapted to combine a temperature reading from the temperature sensor with a raw magnetic field strength reading from the magnetometer to calculate a corrected magnetic field strength $y_c$, as $$y_c = (y_0 - t^x) + C$$

where $y_0$ is the raw magnetometer reading taken from the magnetometer, $t$ is the temperature measured by the temperature sensor, $x$ is a correction exponent and $C$ is a constant.

9. The captured debris level measuring device of claim 8, wherein the correction exponent x is determined according to $$x = \frac{\log(t_1 - t_2)}{\log(y_1 - y_2)}$$

where $y_1$ is the magnetometer reading at temperature $t_1$ and $y_2$ is the magnetometer reading at temperature $t_2$, where $y_1$, $t_1$, $y_2$, $t_2$ are obtained experimentally for a constant amount of magnetic debris within the filter.

10. The captured debris level measuring device of claim 8, wherein the control unit is adapted to compare the corrected magnetic field strength to a stored threshold level, the notification being issued when the corrected magnetometer reading exceeds or drops below the stored threshold level.

11. The captured debris level measuring device of claim 10, wherein the control unit is adapted to detect when the amount of magnetic debris captured continues to increase after the stored threshold level has been crossed, and to update the stored threshold level accordingly.

12. The captured debris level measuring device of claim 8, wherein the control unit includes data transmission means adapted to transmit measured magnetic field strength data to a central server.

13. The captured debris level measuring device of claim 1, wherein the control unit includes data transmission means adapted to transmit measured magnetic field strength data to a central server.

* * * * *